US008427874B2

(12) United States Patent
Kato

(10) Patent No.: US 8,427,874 B2
(45) Date of Patent: Apr. 23, 2013

(54) NON-VOLATILE MEMORY AND METHOD WITH EVEN/ODD COMBINED BLOCK DECODING

(75) Inventor: Yosuke Kato, Yokohama (JP)

(73) Assignee: SanDisk Technologies, Inc., Plano, TX (US)

( * ) Notice: Subject to any disclaimer, the term of this patent is extended or adjusted under 35 U.S.C. 154(b) by 177 days.

(21) Appl. No.: 13/093,082

(22) Filed: Apr. 25, 2011

(65) Prior Publication Data

US 2011/0267885 A1 Nov. 3, 2011

Related U.S. Application Data

(60) Provisional application No. 61/329,674, filed on Apr. 30, 2010.

(51) Int. Cl.
*G11C 16/04* (2006.01)

(52) U.S. Cl.
USPC ............ 365/185.11; 365/185.17; 365/185.18; 365/185.23

(58) Field of Classification Search ............. 365/185.11, 365/185.17, 185.18, 185.23, 230.03
See application file for complete search history.

(56) References Cited

U.S. PATENT DOCUMENTS

| 5,070,032 | A | 12/1991 | Yuan et al. |
|---|---|---|---|
| 5,095,344 | A | 3/1992 | Harari |
| 5,313,421 | A | 5/1994 | Guterman et al. |
| 5,315,541 | A | 5/1994 | Harari et al. |
| 5,343,063 | A | 8/1994 | Yuan et al. |
| 5,570,315 | A | 10/1996 | Tanaka et al. |
| 5,661,053 | A | 8/1997 | Yuan |
| 5,768,192 | A | 6/1998 | Eitan |
| 5,787,047 | A | 7/1998 | Norris et al. |
| 5,903,495 | A | 5/1999 | Takeuchi et al. |
| 6,011,725 | A | 1/2000 | Eitan |
| 6,046,935 | A | 4/2000 | Takeuchi et al. |
| 6,222,762 | B1 | 4/2001 | Guterman et al. |
| 6,967,874 | B2 | 11/2005 | Hosono |
| 7,672,163 | B2 | 3/2010 | Miwa |
| 7,692,966 | B2 * | 4/2010 | Kono et al. .............. 365/185.11 |
| 2002/0176312 | A1 | 11/2002 | Lee et al. |
| 2006/0056263 | A1 | 3/2006 | Otsuka et al. |
| 2008/0037327 | A1 | 2/2008 | Park et al. |

OTHER PUBLICATIONS

Eitan et al., "NROM: A Novel Localized Trapping, 2-Bit Nonvolatile Memory Cell," IEEE Electron Device Letters, vol. 21, No. 11, Nov. 2000, pp. 543-545.

EPO/ISA, "Notification of Transmittal of the International Search Report and the Written Opinion of the International Searching Authority, or the Declaration," corresponding International Patent Application No. PCT/US2011/034372, mailed on Aug. 4, 2011, 9 pages.

* cited by examiner

*Primary Examiner* — David Lam
(74) *Attorney, Agent, or Firm* — Davis Wright Tremaine LLP

(57) ABSTRACT

A nonvolatile memory array is organized into a plurality of interleaving even and odd blocks. When a block is selected for operation, a set of word line voltages are delivered to the block of word lines by space-efficient decoding circuits and scheme. The plurality of blocks is organized into an array of pairs of adjacent odd and even blocks. A first voltage bus allows all even blocks access to the set of word line voltages. A second voltage bus allows all odd blocks access to the set of word line voltages. A decoder for selection is provided for each pair of adjacent even and odd blocks. Selecting a block is effected by selecting the pair of adjacent even and odd blocks containing the selected block, and supplying the set of word line voltages only to the selected block, which is one of the even or odd block in the selected pair.

14 Claims, 12 Drawing Sheets

FIG. 5 *(Prior Art)*

| Selected Block | Node | Bias | Supply |
|---|---|---|---|
| | TG | V(VRDEC) | VRDEC |
| | SGD | V(SGD) | SGD_e |
| | SGS | V(SGS) | SGS_e |
| | WL | V(CGN) | CGI_e |
| | | | |
| Unselected Block(1) | Node | Bias | Supply |
| | TG | V(VRDEC) | VRDEC |
| | SGD | VSS | SGD_o |
| | SGS | VSS | SGS_o |
| | WL | Hi-Z or VSS | CGI_o |
| | | | |
| Unselected Block(2) | Node | Bias | Supply |
| | TG | VSS | VRDEC |
| | SGD | VSS | SGDS |
| | SGS | VSS | SGDS |
| | WL | Hi-Z | CGI_o |

FIG. 7B

| | | Before erase pulse | | | During Erase pulse | |
|---|---|---|---|---|---|---|
| Selected Block | Node | Bias | Supply | | Node | Bias |
| | TG | VDD | VRDEC | | TG | VDD |
| | SGD | VDD-Vt | SGD_e | | SGD | VDD-Vt+$\alpha$*VERA |
| | SGS | VDD-Vt | SGS_e | | SGS | VDD-Vt+$\beta$*VERA |
| | WL | VSS | CGI_e | | WL | VSS |
| | | | | | | |
| Unselected Block(1) | Node | Bias | Supply | | Node | Bias |
| | TG | VDD | VRDEC | | TG | VDD |
| | SGD | VDD-Vt | SGD_o | | SGD | VDD-Vt+$\alpha$*VERA |
| | SGS | VDD-Vt | SGS_o | | SGS | VDD-Vt+$\beta$*VERA |
| | WL | VDD-Vt | CGI_o | | WL | VDD-Vt+$\chi$*VERA |
| | | | | | | |
| Unselected Block(2) | Node | Bias | Supply | | Node | Bias |
| | TG | VSS | VRDEC | | TG | VSS |
| | SGD | VDD-Vt | SGDS | | SGD | VDD-Vt+$\alpha$*VERA |
| | SGS | VDD-Vt | SGDS | | SGS | VDD-Vt+$\beta$*VERA |
| | WL | Hi-Z | CGI_o | | WL | Vt+$\chi$*VERA |

<- $\alpha,\beta,\chi$ represent coupling ratio with CPwell,
Where typically $0 < \alpha,\beta,\chi < 1$ and $\alpha,\beta,\chi > 0.9$ for erase inhibit

FIG. 8B

NON-VOLATILE MEMORY AND METHOD WITH EVEN/ODD COMBINED BLOCK DECODING

CROSS-REFERENCE TO RELATED APPLICATION

The benefit is claimed of U.S. provisional patent application of Yosuke Kato, Application No. 61/329,674 filed on Apr. 30, 2010.

FIELD OF THE INVENTION

This invention relates generally to non-volatile semiconductor memory such as electrically erasable programmable read-only memory (EEPROM) and flash EEPROM, and specifically to efficient implementation of row decoders for the memory array.

BACKGROUND OF THE INVENTION

Solid-state memory capable of nonvolatile storage of charge, particularly in the form of EEPROM and flash EEPROM packaged as a small form factor card, has recently become the storage of choice in a variety of mobile and handheld devices, notably information appliances and consumer electronics products. Unlike RAM (random access memory) that is also solid-state memory, flash memory is non-volatile, and retaining its stored data even after power is turned off. Also, unlike ROM (read only memory), flash memory is rewritable similar to a disk storage device. In spite of the higher cost, flash memory is increasingly being used in mass storage applications. Conventional mass storage, based on rotating magnetic medium such as hard drives and floppy disks, is unsuitable for the mobile and handheld environment. This is because disk drives tend to be bulky, are prone to mechanical failure and have high latency and high power requirements. These undesirable attributes make disk-based storage impractical in most mobile and portable applications. On the other hand, flash memory, both embedded and in the form of a removable card are ideally suited in the mobile and handheld environment because of its small size, low power consumption, high speed and high reliability features.

Flash EEPROM is similar to EEPROM (electrically erasable and programmable read-only memory) in that it is a non-volatile memory that can be erased and have new data written or "programmed" into their memory cells. Both utilize a floating (unconnected) conductive gate, in a field effect transistor structure, positioned over a channel region in a semiconductor substrate, between source and drain regions. A control gate is then provided over the floating gate. The threshold voltage characteristic of the transistor is controlled by the amount of charge that is retained on the floating gate. That is, for a given level of charge on the floating gate, there is a corresponding voltage (threshold) that must be applied to the control gate before the transistor is turned "on" to permit conduction between its source and drain regions. In particular, flash memory such as Flash EEPROM allows entire blocks of memory cells to be erased at the same time.

The floating gate can hold a range of charges and therefore can be programmed to any threshold voltage level within a threshold voltage window. The size of the threshold voltage window is delimited by the minimum and maximum threshold levels of the device, which in turn correspond to the range of the charges that can be programmed onto the floating gate. The threshold window generally depends on the memory device's characteristics, operating conditions and history. Each distinct, resolvable threshold voltage level range within the window may, in principle, be used to designate a definite memory state of the cell.

It is common in current commercial products for each storage element of a flash EEPROM array to store a single bit of data by operating in a binary mode, where two ranges of threshold levels of the storage element transistors are defined as storage levels. The threshold levels of transistors correspond to ranges of charge levels stored on their storage elements. In addition to shrinking the size of the memory arrays, the trend is to further increase the density of data storage of such memory arrays by storing more than one bit of data in each storage element transistor. This is accomplished by defining more than two threshold levels as storage states for each storage element transistor, four such states (2 bits of data per storage element) now being included in commercial products. More storage states, such as 16 states per storage element, are also being implemented. Each storage element memory transistor has a certain total range (window) of threshold voltages in which it may practically be operated, and that range is divided into the number of states defined for it plus margins between the states to allow for them to be clearly differentiated from one another. Obviously, the more bits a memory cell is configured to store, the smaller is the margin of error it has to operate in.

The transistor serving as a memory cell is typically programmed to a "programmed" state by one of two mechanisms. In "hot electron injection," a high voltage applied to the drain accelerates electrons across the substrate channel region. At the same time a high voltage applied to the control gate pulls the hot electrons through a thin gate dielectric onto the floating gate. In "tunneling injection," a high voltage is applied to the control gate relative to the substrate. In this way, electrons are pulled from the substrate to the intervening floating gate. While the term "program" has been used historically to describe writing to a memory by injecting electrons to an initially erased charge storage unit of the memory cell so as to alter the memory state, it has now been used interchangeable with more common terms such as "write" or "record."

The memory device may be erased by a number of mechanisms. For EEPROM, a memory cell is electrically erasable, by applying a high voltage to the substrate relative to the control gate so as to induce electrons in the floating gate to tunnel through a thin oxide to the substrate channel region (i.e., Fowler-Nordheim tunneling.) Typically, the EEPROM is erasable byte by byte. For flash EEPROM, the memory is electrically erasable either all at once or one or more minimum erasable blocks at a time, where a minimum erasable block may consist of one or more sectors and each sector may store 512 bytes or more of data.

The memory device typically comprises one or more memory chips that may be mounted on a card. Each memory chip comprises an array of memory cells supported by peripheral circuits such as decoders and erase, write and read circuits. The more sophisticated memory devices also come with a controller that performs intelligent and higher level memory operations and interfacing.

There are many commercially successful non-volatile solid-state memory devices being used today. These memory devices may be flash EEPROM or may employ other types of nonvolatile memory cells. Examples of flash memory and systems and methods of manufacturing them are given in U.S. Pat. Nos. 5,070,032, 5,095,344, 5,315,541, 5,343,063, and 5,661,053, 5,313,421 and 6,222,762. In particular, flash memory devices with NAND string structures are described in U.S. Pat. Nos. 5,570,315, 5,903,495, 6,046,935. Also nonvolatile memory devices are also manufactured from memory cells with a dielectric layer for storing charge. Instead of the conductive floating gate elements described earlier, a dielectric layer is used. Such memory devices utilizing dielectric storage element have been described by Eitan et al., "NROM: A Novel Localized Trapping, 2-Bit Nonvolatile Memory Cell," IEEE Electron Device Letters, vol. 21, no. 11, November 2000, pp. 543-545. An ONO dielectric layer extends across the channel between source and drain diffusions. The charge for one data bit is localized in the dielectric layer adjacent to the drain, and the charge for the other data bit is localized in the dielectric layer adjacent to the source. For example, U.S. Pat. Nos. 5,768,192 and 6,011,725 disclose a nonvolatile memory cell having a trapping dielectric sandwiched between two silicon dioxide layers. Multi-state data storage is implemented by separately reading the binary states of the spatially separated charge storage regions within the dielectric.

With flash memory, the memory cells are organized into an array of blocks where the cells in each block are typically erased together as a unit. With higher and higher memory density in each generation of memory chip, the number of blocks in a memory array is also increasing. Each block may be considered as a row in the array and there a row decoder is needed to address each block. Such a row decoder will also be referred to as a block decoder. As the number of blocks increases in a memory, so does the number of block decoders. However, the size of block decoders does not scale at the same rate as increase in memory cells. Increasingly, block decoders will occupy a larger portion of the peripheral circuits of the chip. Furthermore, the larger number of block decoders will also consume more current.

It is therefore desirable to reduce the overhead of a conventional block decoder and to reduce current consumption.

SUMMARY AND OBJECTS OF THE INVENTION

According to a primary aspect of the invention, a nonvolatile memory array is organized into a plurality of interleaving even and odd blocks. When a block is selected for operation, a set of word line voltages are delivered to the block of word lines by space-efficient decoding circuits and scheme. The plurality of blocks is organized into an array of pairs of adjacent odd and even blocks. A first voltage bus allows all even blocks access to the set of word line voltages. A second voltage bus allows all odd blocks access to the set of word line voltages. A block decoder for selection a pair of blocks is provided for each pair of adjacent even and odd blocks. Selecting a block is effected by selecting the pair of adjacent even and odd blocks containing the selected block, and supplying the set of word line voltages only to the selected block, which is one of the even or odd block in the selected pair.

According to another aspect of the invention, a method of operating a nonvolatile memory array includes organizing the array of memory cells into a plurality of blocks having interleaving even and odd blocks; each block having a block of word lines for accessing the each block of memory cells; providing a first voltage bus for all even blocks to access a set of word line voltages; providing a second voltage bus for all odd blocks to access the set of word line voltages; providing a block decoder for each pair of adjacent even and odd blocks among the plurality of blocks; transferring the set of word line voltages to a selected block of word lines by: putting the set of word line voltages on the first voltage bus or on the second voltage bus depending on whether the selected block of word lines is in an even block or in an odd block; and decoding a block decoder for a pair of adjacent even and odd blocks containing the selected block of word lines, the decoded block decoder enabling bus transfer of the first voltage bus to the even block of word lines in the selected pair of adjacent blocks and enabling bus transfer of the second voltage bus to the odd block of word lines in the selected pair of adjacent blocks.

The row or block decoders are implemented in circuit elements able to withstand the high voltages needed by the word lines. Consequently, they are necessarily of relatively large size. By decoding two blocks at a time, the number of decoding circuits is halved and space saving can be realized, although at the expense of doubling the number voltage buses. However, there is a net gain in saving space because the saving is gained with increasing number of blocks while the expense remains the same. Also, the doubling of the voltage buses will reduce by a half the junction capacitance on the word lines.

Additional objects, features and advantages of the present invention will be understood from the following description of its preferred embodiments, which description should be taken in conjunction with the accompanying drawings.

BRIEF DESCRIPTION OF THE DRAWINGS

FIG. 7B is a table illustrating the operating voltages shown in FIG. 7A.

FIG. 8B is a table illustrating the operating voltages shown in FIG. 8A.

DESCRIPTION OF THE PREFERRED EMBODIMENTS

Figure 1:
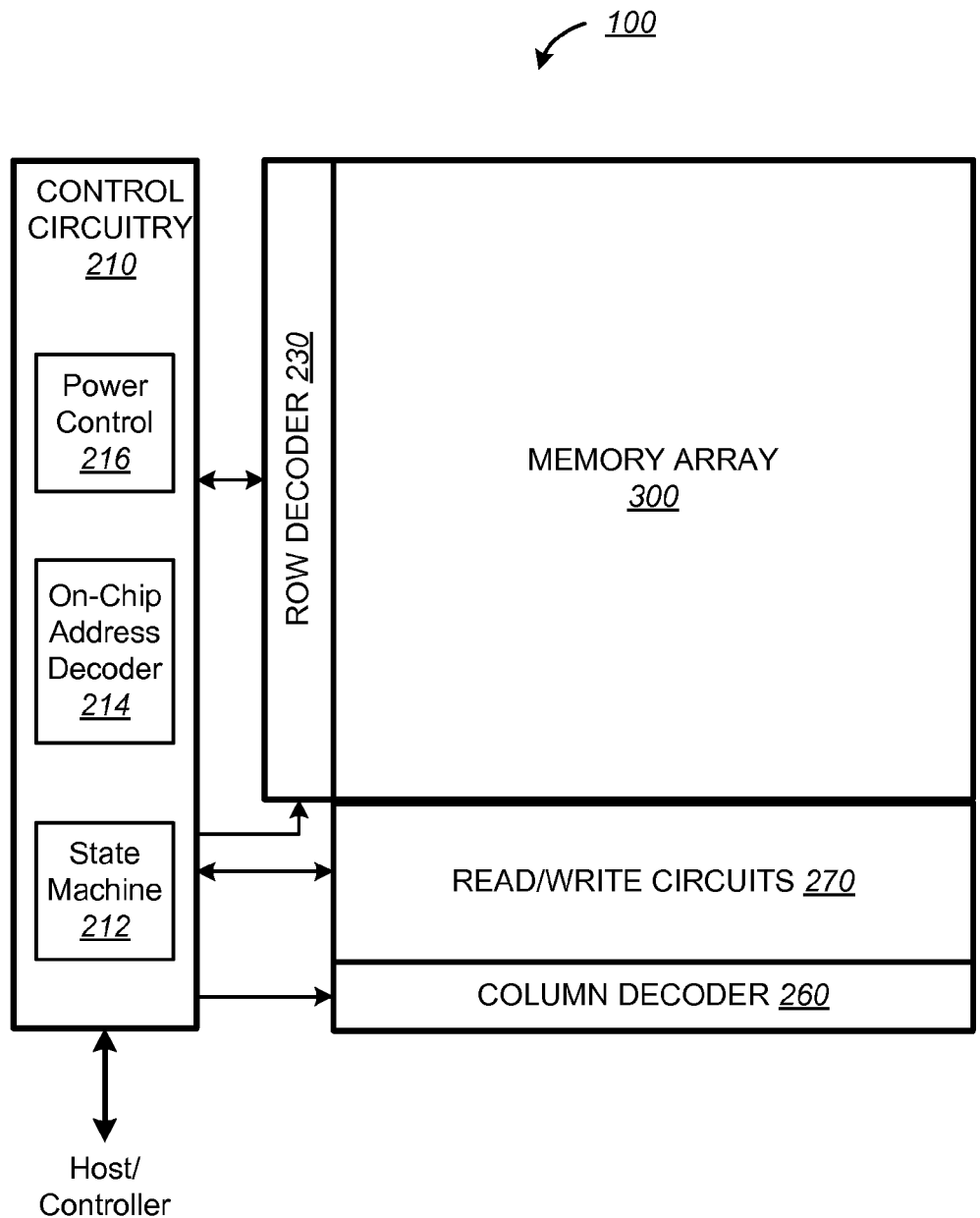
FIG. 1 illustrates schematically a compact memory device which provides the context in which the present invention is implemented.

FIG. 1 illustrates schematically a compact memory device which provides the context in which the present invention is implemented. The memory device 100, usually in the form of a memory chip, includes a two-dimensional array of memory cells 300, control circuitry 210, and read/write circuits 270. The memory array 300 is addressable by word lines via a row decoder 230 and by bit lines via a column decoder 260. The read/write circuits 270 allow a page of memory cells to be read or programmed in parallel.

The control circuitry 210 cooperates with the read/write circuits 270 to perform memory operations on the memory array 300. It also interfaces with an external host or a memory controller to exchange. The control circuitry 210 includes a state machine 212, an on-chip address decoder 214 and a power control module 216. The state machine 212 provides chip level control of memory operations. The on-chip address decoder 214 provides an address interface between that used by the host or a memory controller to the hardware address used by the decoders 230 and 270. The power control module 216 controls the power and voltages supplied to the word lines and bit lines during memory operations.

If a preferred arrangement of the compact memory device shown in FIG. 1 has the various peripheral circuits implemented in a symmetric fashion on opposite sides of the array 300 so that access lines and circuitry on each side are reduced in half. Thus, the row decoder is split into top and bottom row decoders and the column decoder is split into top and bottom column decoders. Similarly, the read/write circuits are split into top and bottom read/write circuits (not shown).

Figure 2:
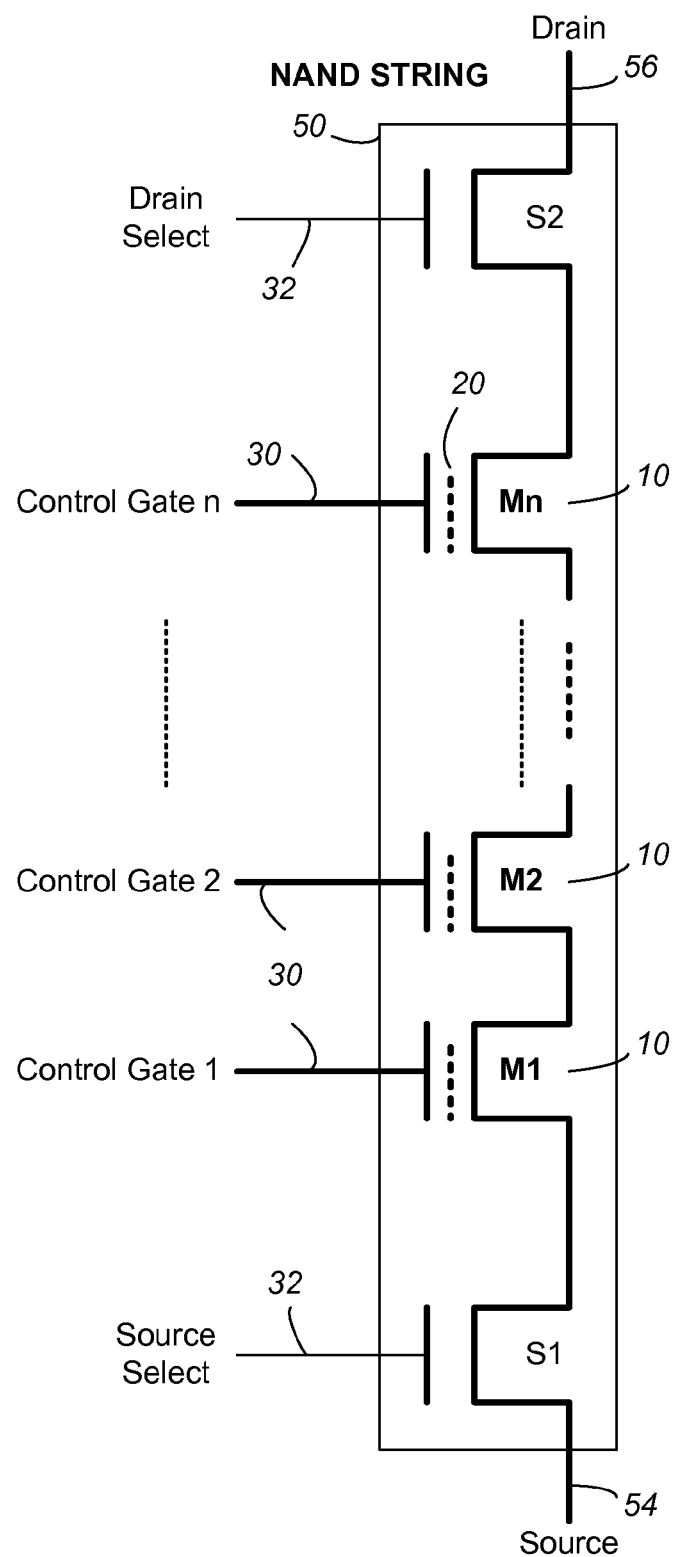
FIG. 2 illustrates schematically a string of memory cells organized into an NAND string.

FIG. 2 illustrates schematically a string of memory cells organized into an NAND string. An NAND string 50 comprises of a series of memory transistors M1, M2, . . . , Mn (e.g., n=4, 8, 16 or higher) daisy-chained by their sources and drains. A pair of select transistors S1, S2 controls the memory transistors chain's connection to the external via the NAND string's source terminal 54 and drain terminal 56 respectively. When the source select transistor S1 is turned on by a signal on the source select control gate 32, the source terminal is coupled to a source line (see FIG. 3). Similarly, when the drain select transistor S2 is turned on by a signal on the drain select control gate 33, the drain terminal of the NAND string is coupled to a bit line of the memory array. Each memory transistor 10 in the chain acts as a memory cell. It has a charge storage element 20 to store a given amount of charge so as to represent an intended memory state. A control gate 30 of each memory transistor allows control over read and write operations.

When an addressed memory transistor 10 within an NAND string is read or is verified during programming, its control gate 30 is supplied with an appropriate voltage. At the same time, the rest of the non-addressed memory transistors in the NAND string 50 are fully turned on by application of sufficient voltage on their control gates. In this way, a conductive path is effective created from the source of the individual memory transistor to the source terminal 54 of the NAND string and likewise for the drain of the individual memory transistor to the drain terminal 56 of the cell. Memory devices with such NAND string structures are described in U.S. Pat. Nos. 5,570,315, 5,903,495, 6,046,935.

Figure 3:
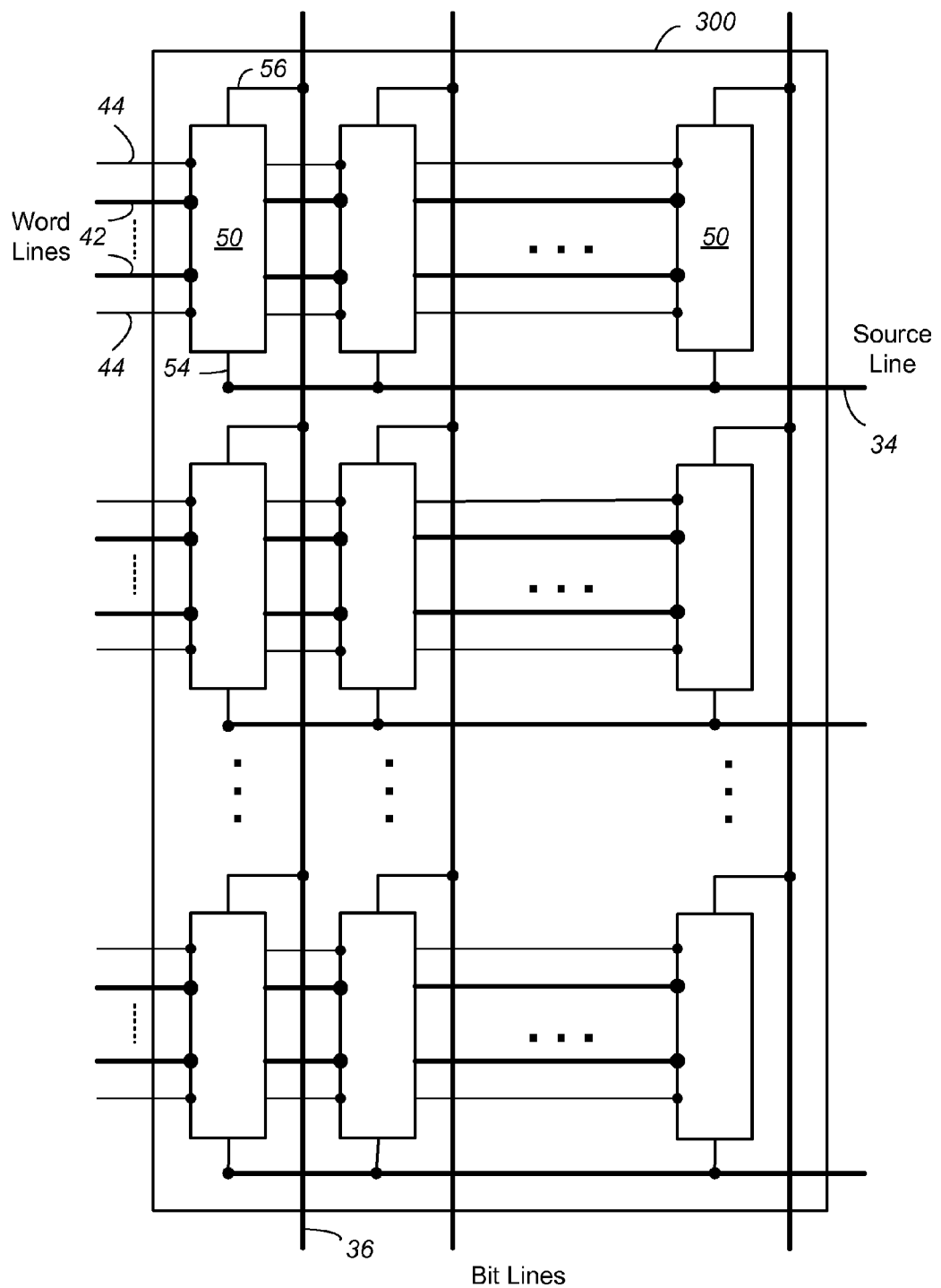
FIG. 3 illustrates an example of an NAND array 300 of memory cells, constituted from NAND strings 50 such as that shown in FIG. 2.

FIG. 3 illustrates an example of an NAND array 300 of memory cells, constituted from NAND strings 50 such as that shown in FIG. 2. Along each column of NAND strings, a bit line such as bit line 36 is coupled to the drain terminal 56 of each NAND string. Along each bank of NAND strings, a source line such as source line 34 is couple to the source terminals 54 of each NAND string. Also the control gates along a row of memory cells in a bank of NAND strings are connected to a word line such as word line 42. The control gates along a row of select transistors in a bank of NAND strings are connected to a select line such as select line 44. An entire row of memory cells in a bank of NAND strings can be addressed by appropriate voltages on the word lines and select lines of the bank of NAND strings. When a memory transistor within a NAND string is being read, the remaining memory transistors in the string are turned on hard via their associated word lines so that the current flowing through the string is essentially dependent upon the level of charge stored in the cell being read.

Figure 4:
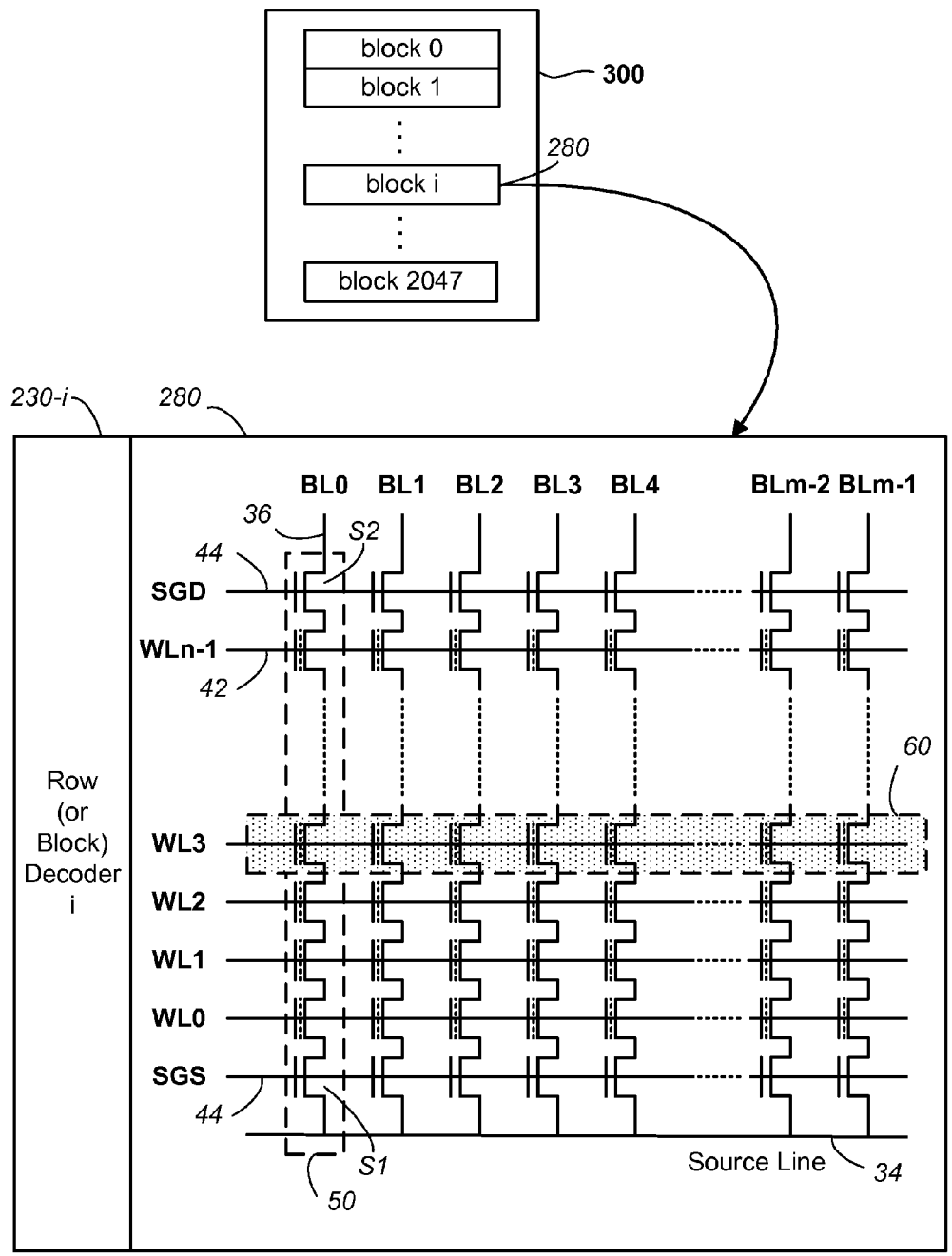
FIG. 4 illustrates the NAND array of shown in FIG. 3 being organized into blocks.

FIG. 4 illustrates the NAND array of shown in FIG. 3 being organized into blocks. In one embodiment, each block 280 is constituted from a row of NAND strings 50. Each NAND string is formed by daisy-chaining n memory cells and terminated by the source select transistor S1 at the source terminal 34 and the drain select transistor S2 at the drain terminal 36. A "page" such as the page 60, is a group of memory cells enabled to be sensed or programmed in parallel. In this example, the page is form by a row of m memory cells in the block. For example if there are 66 memory cells in each NAND string, then there are 66 pages in a block such as the block 280-i. The page is enabled by the control gates of the cells of the page connected in common to a word line 42 and each cell accessible by a sensing circuit in the read/write circuits 270 (see FIG. 1) accessible via a bit line 36.

Referring also to FIG. 1, the row decoder 230 is responsible for delivering selected voltages from the power control circuit 216 to selected individual word lines and control lines for each of the blocks in the memory array 300 shown in FIG. 4.

FIG. 4 also shows a row decoder 230-i, which is part of the row decoder 230 shown in FIG. 1, for decoding the block 280-i. When decoding a block of memory cells, the row decoder will also be referred to as a block decoder, such as a block decoder 230-i. For example, when respectively sensing or programming the page of cells 60, the block 280 of NAND strings is accessed by asserting the signals SGS and SGD to turn on S1 and S2 respectively. A sensing voltage or a programming voltage is respectively applied to the common word line WL3 together with appropriate voltages on the bit lines. At the same time the unselected word lines WL0, WL1, WL2, WL4, WL5, . . . , WL65 will be biased at some predetermined voltage. Since word line voltages can be as high as 25V as compared to CMOS logic voltage of about (2-5V) the block decoder for each block of word lines is necessarily of large size to withstand the higher voltages.

Figure 5:
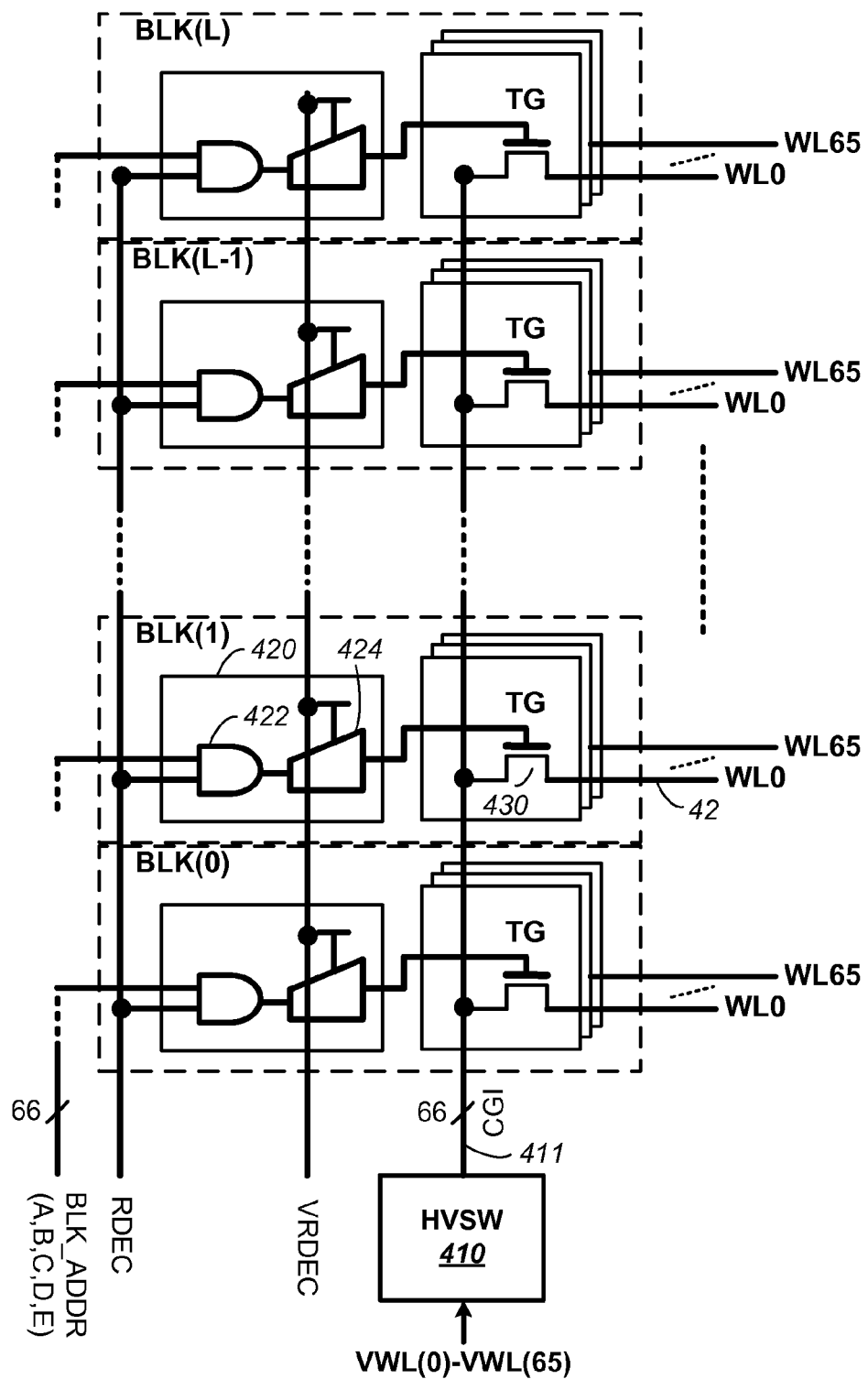
FIG. 5 illustrates schematically a conventional block decoder for the word lines and control lines of a block such as block 280-$i$ shown in FIG. 4.

FIG. 5 illustrates schematically a conventional block decoding scheme for an array of memory blocks. The blocks (BLK(0), BLK(1), . . . BLK(L-1), BLK(L) are grouped in pairs for convenience of comparison later. Within each block, such as block 280-i shown in FIG. 4, there is a block of n word lines 42 (WL0, WL1, . . . WLn-1). In the current example n=66 and there are 66 memory cells in series in the NAND string, and the block of word lines would have 66 word lines (WL0, WL1, . . . , WL65). Also there are 2 control lines (SGS and SGD) which are not shown explicitly in FIG. 5.

A high-voltage switch HVSW 410 is employed to switch a set of word line voltages VWL(0)-VWL(65) (or CGI) onto a voltage bus 411 to be accessed by the selected block of word lines WL0 to WL65. A transfer gate TG 430 for each word line 42 connects between each word line 42 of the block and a corresponding bus line in the voltage bus 411. There is therefore a corresponding block of transfer gates TG 430 for the block of word lines. The block of transfer gates TG 430 is controlled by a control voltage output from a block decoder 420. When the individual transfer 430 gates have a control voltage sufficiently higher than the voltages from the voltage bus 411, the transfer gate is turned on and the set of word line voltages is passed onto the selected block of word lines WL0 to WL65.

Each transfer gate 430 is controlled by a corresponding block decoder 420 comprising a logic circuit 422 whose output drives a level-shifter 424 to produce the sufficiently high control voltage.

In the current example, each block will have one block decoder 420 for selecting the block of 66 word lines. The 66 transfer gates 420 responsive to the output of the block decoder 420 will transfer the set of word line voltages from the voltage bus 411 via the 66 high voltage switches to the block of 66 word lines.

It will be seen in this conventional architecture there is a dedicated block decoder 420 for each block. In the current example of 2048 blocks in the array, these amount to 2048 block decoders. They occupy an appreciable amount of the memory chip's area.

It is therefore desirable to reduce the number of block decoders in the peripheral circuits of the memory chip.

Even/Odd Blocks-Combined Decoding

According to a primary aspect of the invention, a nonvolatile memory array is organized into a plurality of interleaving even and odd blocks. When a block is selected for operation, a set of word line voltages is delivered to the block of word lines by space-efficient decoding circuits and scheme. The plurality of blocks is organized into an array of pairs of adjacent odd and even blocks. A first voltage bus allows all even blocks access to the set of word line voltages. A second voltage bus allows all odd blocks access to the set of word line voltages. A block decoder for selecting a pair of blocks is provided for each pair of adjacent even and odd blocks. Selecting a block is effected by selecting the pair of adjacent even and odd blocks containing the selected block, and supplying the set of word line voltages only to the selected block, which is one of the even or odd block in the selected pair.

Figure 6:
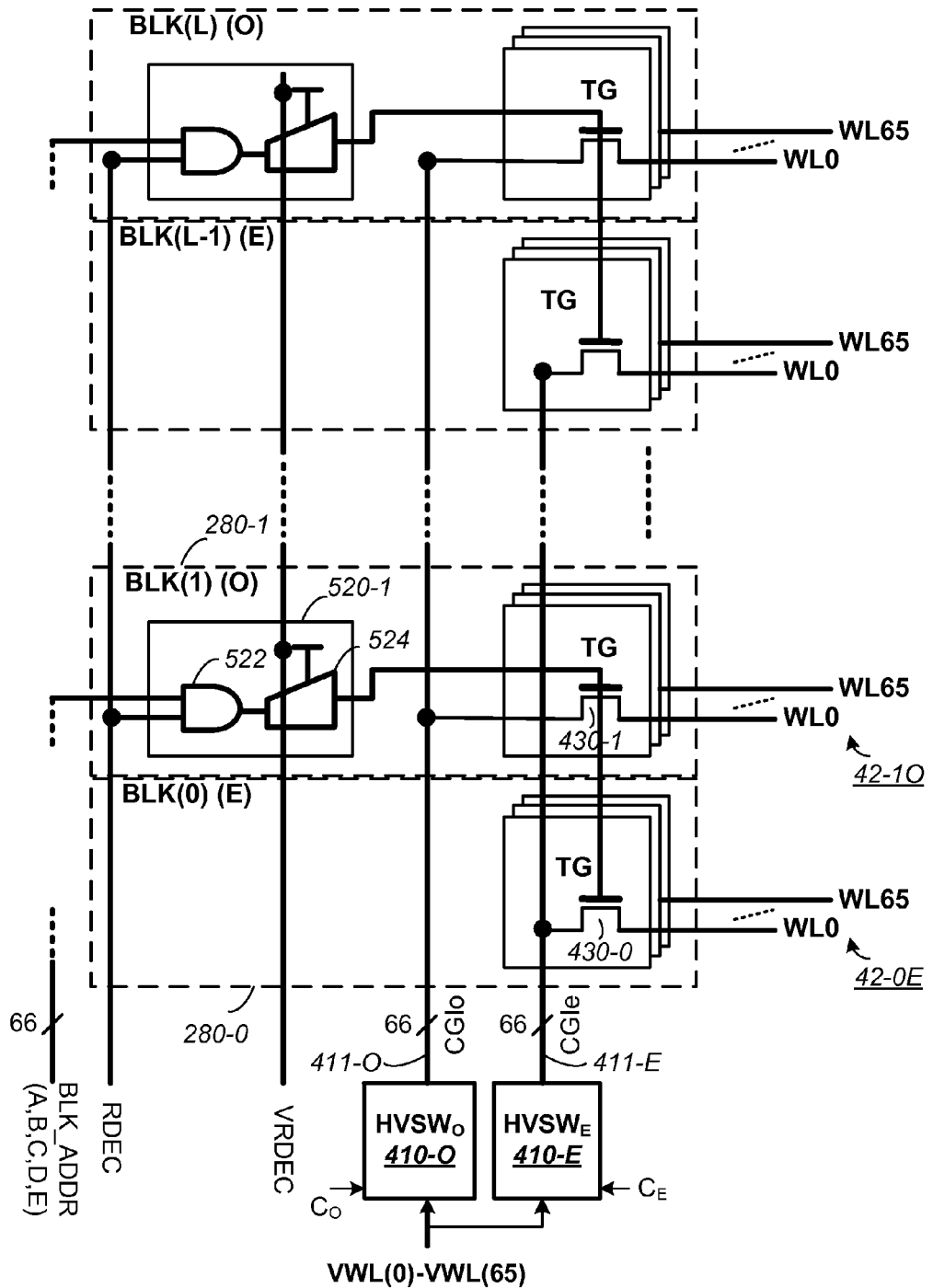
FIG. 6 illustrates a block decoder architecture according to the present invention.

FIG. 6 illustrates a block decoder architecture according to the present invention. Essentially, the number of block decoders is reduced by 50% by sharing one block decoder between a pair of even and odd blocks. For example, the block of word lines in block BLK(0) (even) and the block of word lines in block BLK(1) (odd) both have their transfer gates controlled by the signal from a common block decoder 520-1; similarly for the blocks BLK(L−1) (even) and BLK(L) (odd). In other words, whereas prior configurations have each block served by one block decoder 420, the present scheme has a pair of adjacent even and odd blocks sharing one common block decoder 520.

Similar to that shown in FIG. 5, the block of transfer gate 430-1 connected to the block of word lines 42-1O is controlled by the common block decoder 520-1. The block decoder 520-1 comprises a logic circuit 522 whose output drives a level-shifter 524 to produce the sufficiently high control voltage. In the preferred embodiment, the logic circuit 522 is an AND gate, where one set of inputs receives a block select address, BLK_ADDR, and the other input receives an enable signal RDEC.

In the present invention, the decoding arrangement for the selected block of word lines 42-1O in BLK(1) (odd) is effected by asserting a block address to the common block decoder 520-1, which in turn outputs a decoded control signal to turn on the block of transfer gates for the block of word lines 42-1O so that it can access the set of word line voltages put on the voltage bus 411-O by the high-voltage switch HVSW-O.

In the present invention, the single voltage bus 411 of a conventional memory device as shown in FIG. 5 is replaced by two independent voltage buses 411-E and 411-O. The voltage bus 411-E is connected to the transfer gates of all even blocks in the array. The voltage bus 411-O O is connected to the transfer gates of all odd blocks in the array. A high-voltage switches 410-O O controlled by a control signal $C_O$ selectively puts the set of word line voltages (CGIo) onto the voltage bus 411-O. A high-voltage switches 410-E controlled by a control signal $C_E$ selectively puts the set of word line voltages (CGIe) onto the voltage bus 411-E. With the selective control of supply the set of word line voltages to either the even blocks or the odd blocks, even through a pair of even and odd blocks are selected together, it is possible to further select either the even or odd blocks among the pair.

For example, the pair of blocks BLK(0) and BLK(1) is selected together by the common block decoder 520-1. If it is desired to supply the set of word line voltages to the block of word lines 42-1O in BLK(1), the high-voltage switch 410-O is enabled by asserting the control signal $C_O$ while the high-voltage switch 410-E is disabled by de-asserting the control signal $C_E$. On the other hand if it is desired to supply the set of word line voltages to the block of word lines 42-0E in BLK(0), the high-voltage switch 410-E is enabled by asserting the control signal $C_E$ while the high-voltage switch 410-O is disabled by de-asserting the control signal $C_O$.

The combined decoding of the even/odd pair has the additional cost of doubling the set of word line/control line supply circuits and supply lines, one set for even block and one set for odd block. However, the benefit is a 50% reduction in the logic and level-shifter circuits among the blocks. In other word, while the number of high-voltage switches and the set of vertical supply lines are doubled from one switch to two, the number of block decoders are reduced from 2048 to 1024.

In the same vein, there could be further reduction if a group of more than two blocks are decoded together. For example, if there are 4 blocks decoded together, only a quarter of the decoding circuits compared to those of the conventional will be needed. However, the corresponding cost will be a dedicated supply circuit and vertical supply lines for each block of the group. In practice, the limit is due to available space for laying out additional vertical supply lines. It has been found at least doubling of the vertical supply lines is quite feasible.

The same principle of combined even/odd block decoding can be applied to the control lines SGS and SGD.

In general, for a block of n word lines, there will be n word line voltages for the n word lines. In practice some of the word lines have the same voltages and therefore the number of different voltages in the set of word line voltages is less than n. Variations in implementation of supplying these voltages are possible. For example, in some of the examples that will be shown in FIG. 7 and FIG. 8, the voltage source has a number of preset voltage levels, such as CGN. A preferred high-voltage switch switching between different irreducible voltage levels into a voltage bus in a non-volatile memory is disclosed in U.S. Pat. No. 7,672,163, which entire disclosure is incorporated herein by reference.

Figure 7A:
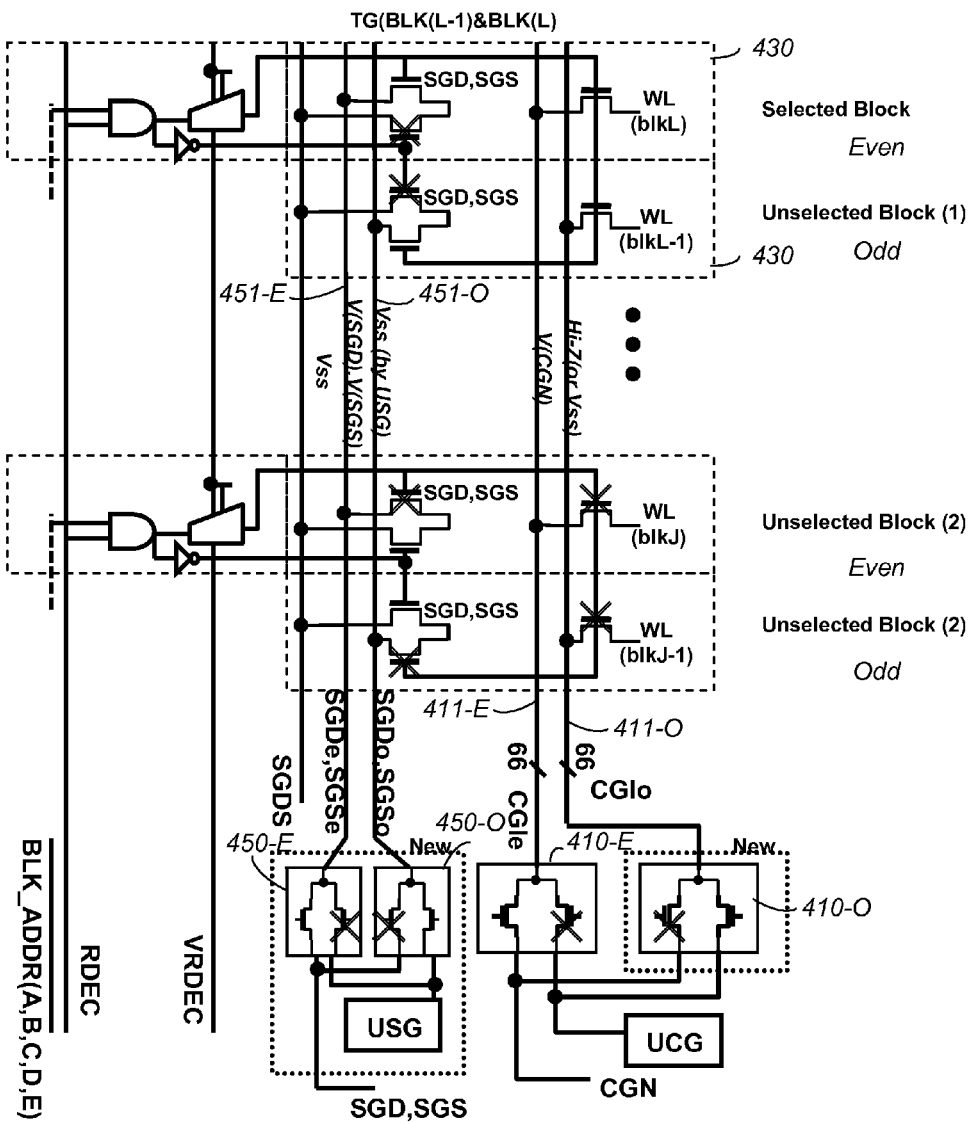
FIG. 7A illustrates in more detail the voltage conditions for the operation of the select lines SGS and SGD and the word lines WL for the selected and unselected blocks during program or read operations.

FIG. 7A illustrates in more detail the voltage conditions for the operation of the select lines SGS and SGD and the word lines WL for the selected and unselected blocks during program or read operations. For the select lines SGS and SGD (see FIG. 4) in each pair of even/odd blocks, a pair of control voltage buses 451-E and 451-O allows access to the voltages SGS and SGD via a pair of control voltage switches 450-E and 450-O.

FIG. 7B is a table illustrating the operating voltages shown in FIG. 7A. For example, the set of word line voltages supplied to the unselect blocks includes standard voltages for memory devices such as VSS and VDD.

Figure 8A:
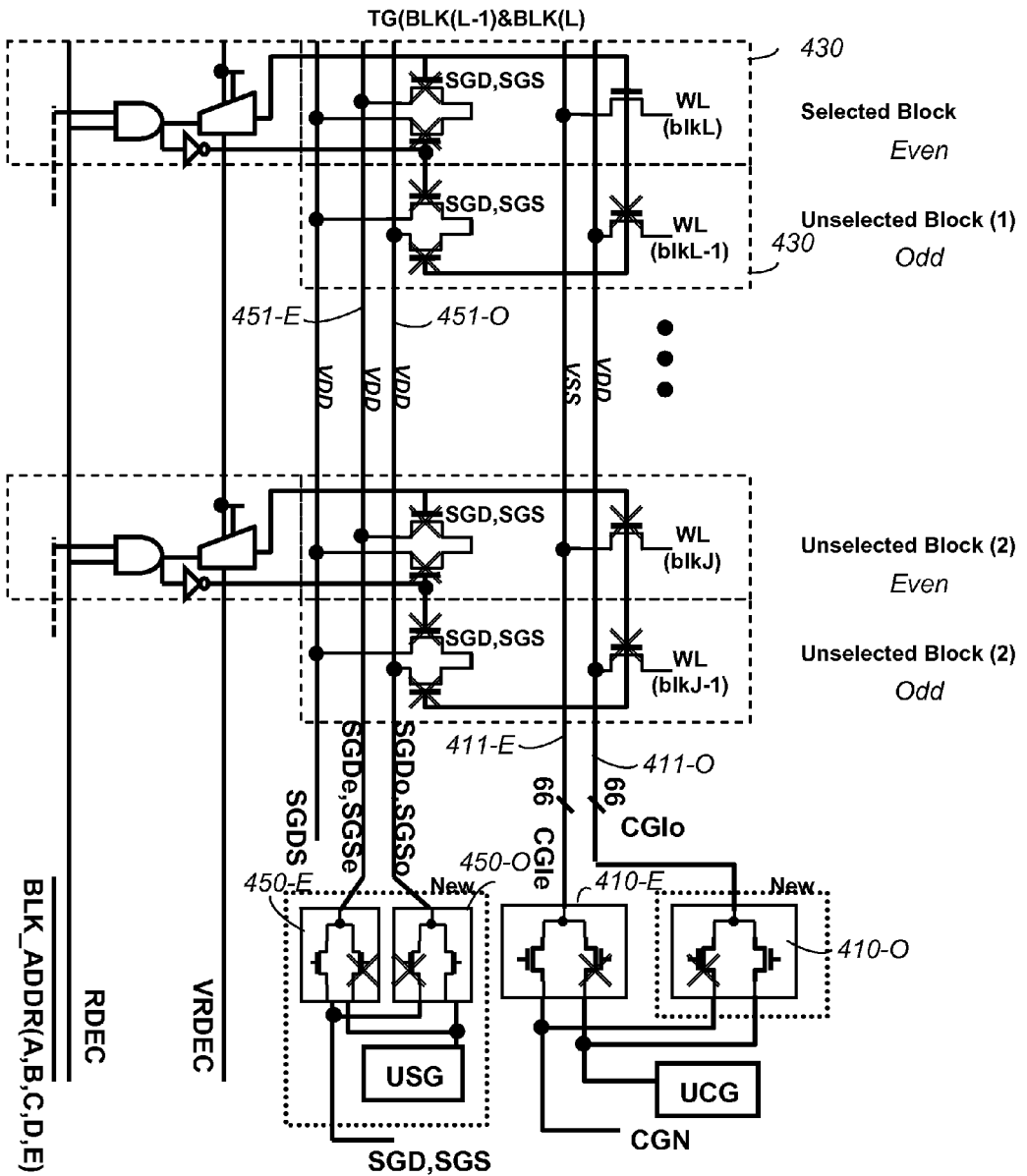
FIG. 8A illustrates in more detail the voltage conditions for the operation of the select lines SGS and SGD and the word lines WL for the selected and unselected blocks during erase operations.

FIG. 8A illustrates in more detail the voltage conditions for the operation of the select lines SGS and SGD and the word lines WL for the selected and unselected blocks during erase operations. The decoding configuration for WL is similar to those of the program or read operations. However, the decoding of the control lines among the combined pair of blocks is different. For the unselected block in the pair, instead of the transfer gates 430 (Odd) being on and the supply HVSWo 410-O being off or transferring Vss, the HVSW$_O$ 410-O forces CGIo's on the voltage bus 411-O to be positive biasing voltages (e.g., VDD) so that the transfer gates are turned off and the HVSWo's are on to supply positive biasing voltages. Even though the transfer gates of the odd block are controlled with the common signal from the selected even block, the transfer gates of the odd block can still be turned off if a sufficiently high drain voltage (e.g., VDD) is supplied to the drain of the transfer gate transistor. In general, when the drain voltage of the transfer gate transistor is within a threshold Vth of the gate voltage, the transfer gate is turned off.

FIG. 8B is a table illustrating the operating voltages shown in FIG. 8A. The voltages V(VRDEC), V(SGS), V(SGD), V(CGN) are all common voltage levels typically used in a selected block in nonvolatile memories. The other voltage levels are also well known in erase operations of NAND memories, as for example disclosed in U.S. Pat. No. 6,967,874.

Figure 9:
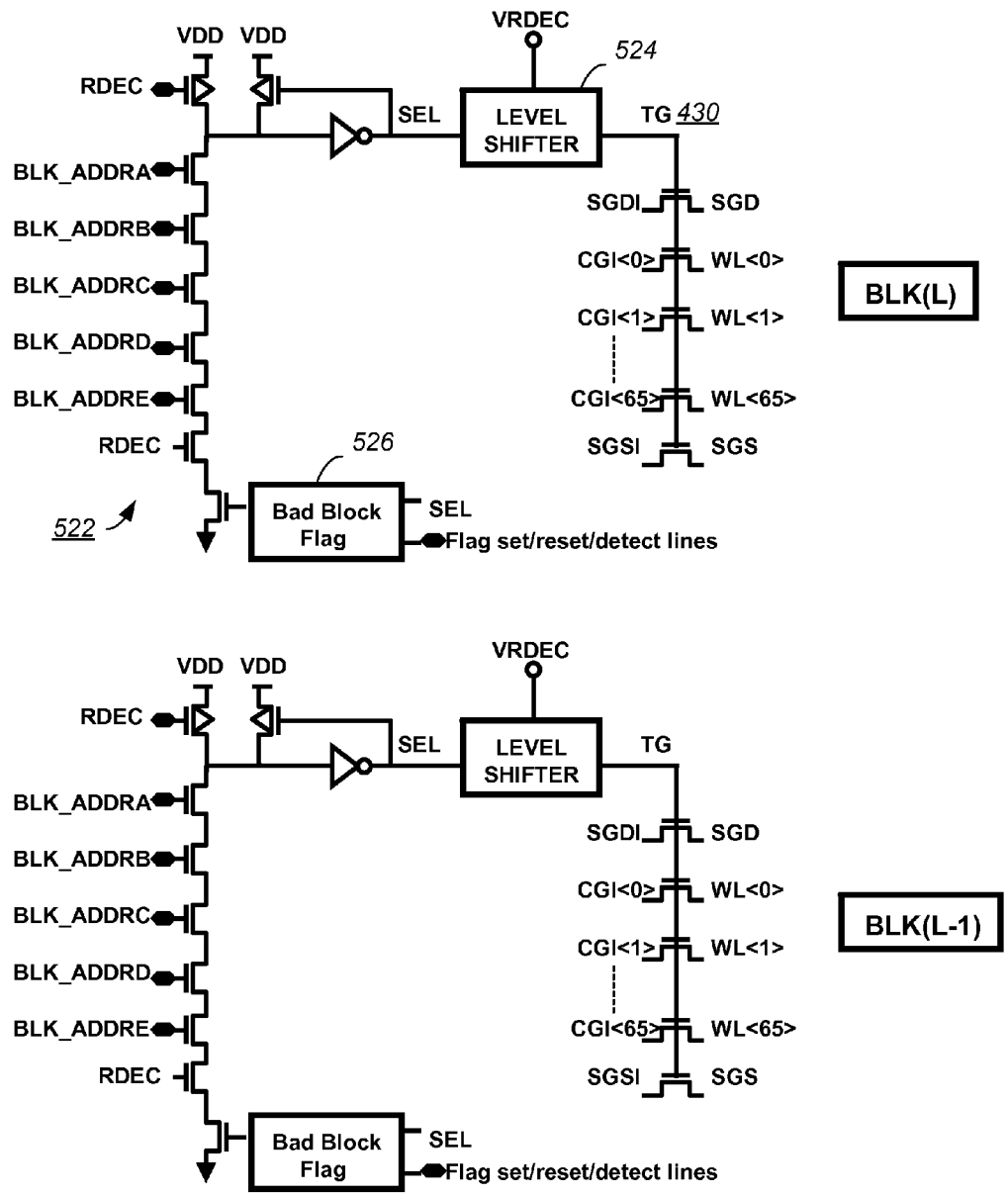
FIG. 9 illustrates a conventional implementation in which there is an independent block decoder for each block.

FIG. 9 illustrates a conventional implementation in which there is an independent block decoder for each block. An additional detail is a bad block flag latch 526 which provides a status of the useability of the block. If the latch indicates the block to be bad, it will disable the address decoder.

Figure 10:
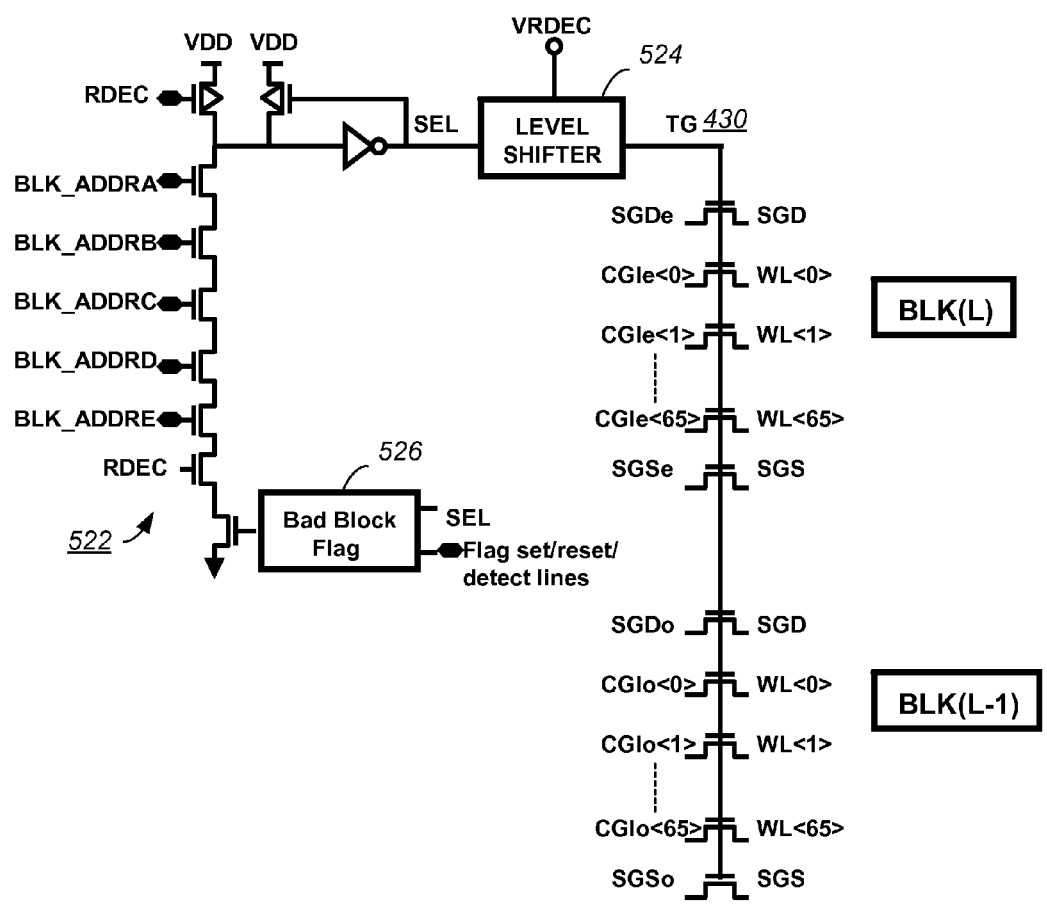
FIG. 10 illustrates a preferred implementation of the even/odd combined block decoder for a pair of blocks similar to that shown in FIG. 6.

FIG. 10 illustrates a preferred implementation of the even/odd combined block decoder for a pair of blocks similar to that shown in FIG. 6. An additional detail is a bad block flag latch 526 which provides a status of the useability of the block. If the latch indicates the block to be bad, it will disable the address decoder.

Figure 11:
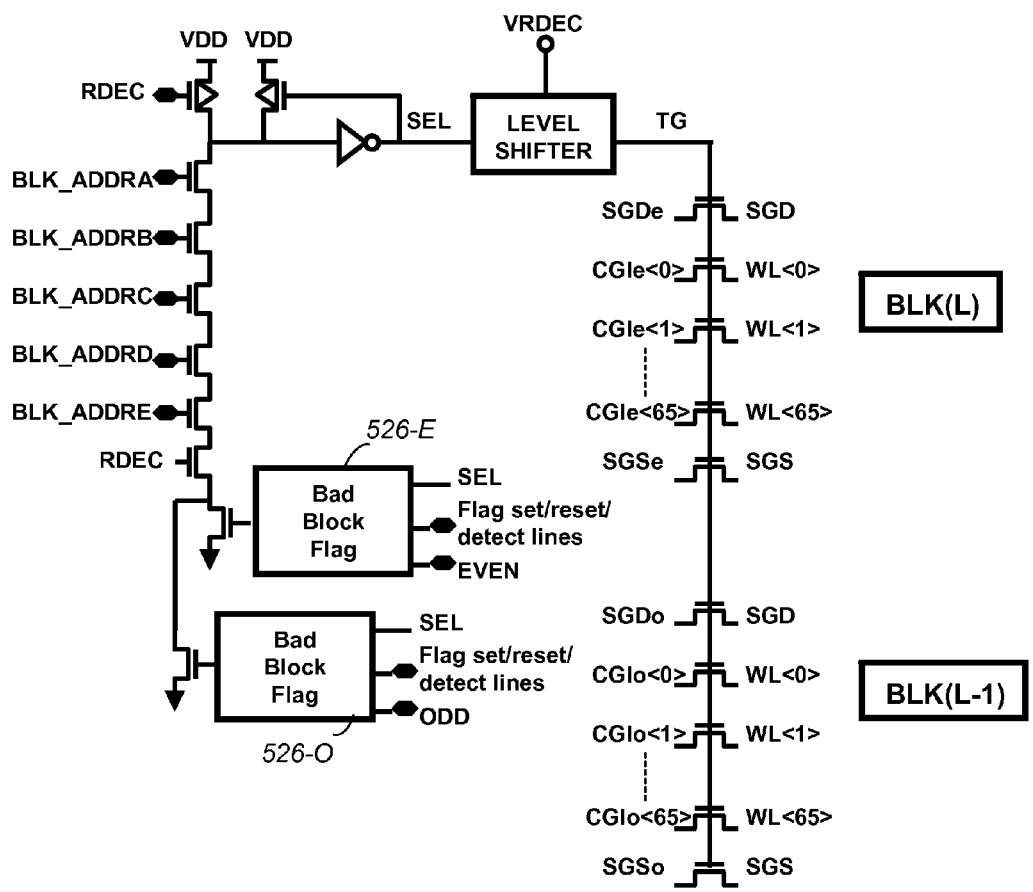
FIG. 11 illustrates an alternative preferred implementation of the even/odd combined block decoder in which each block has a dedicated bad block flag latch.

FIG. 11 illustrates an alternative preferred implementation of the even/odd combined block decoder in which each block has a dedicated bad block flag latch. Since there are two blocks in each even/odd pair, two bad block flag latches 526-E and 526-O are provided respectively for the even and odd blocks in the pair.

The architecture of the even/odd combined block decoders also has another benefit. By splitting the blocks in the arrays into even and odd groups, the loading on the word line/control line supply circuit is correspondingly reduced. This also means that a smaller size charge pump will suffice to supply the power.

While the embodiments of this invention that have been described are the preferred implementations, those skilled in the art will understand that variations thereof may also be possible.

The invention claimed is:

1. A nonvolatile memory, comprising:
an array of memory cells organized into a plurality of blocks having interleaving even and odd blocks, each block having a block of word lines for accessing the each block of memory cells;
a first voltage bus for all even blocks to access a set of word line voltages;
a second voltage bus for all odd blocks to access the set of word line voltages;
a block decoder for each pair of adjacent even and odd blocks among the plurality of blocks;
a voltage source for supplying the individual voltages;
a first voltage switch for switching the voltage source to the first voltage bus when the selected block of word lines is even;
a second voltage switch for switching the voltage source to the second voltage bus when the selected block of word lines is odd; and wherein:
when a selected block of word lines is to receive the set of word line voltages,
a pair of adjacent even and odd blocks containing the selected block of word lines is responsive to a respective block decoder being decoded to enable bus transfer of the first voltage bus to the even block of word lines in the selected pair of adjacent blocks and enabling bus transfer of the second voltage bus to the odd block of word lines in the selected pair of adjacent blocks.

2. The nonvolatile memory as in claim 1, wherein said nonvolatile memory is of the NAND type, and the block of word lines are associated with word lines of an NAND string.

3. The nonvolatile memory as in claim 1, further comprising:
a block of transfer gates, one for each word line among a block of word lines, said block of transfer gate connected between a respective block of word lines and either one of the first voltage bus or the second voltage bus; and wherein:
the selected block of word lines is enabled for bus transfer responsive to a respective block of transfer gates of the selected block being enabled.

4. The nonvolatile memory as in claim 3, wherein the respective block of transfer gates is enabled by a respective block decoder.

5. The nonvolatile memory as in claim 1, wherein said block decoder for a block further comprises:
a logic circuit gated by an enable signal for passing a decoded signal; and
a level shifter connected to receive the decoded signal and to output the decoded signal at a higher level sufficient to enable bus transfer of the first voltage bus or the second voltage bus.

6. The nonvolatile memory as in claim 5, further comprising:
a block of transfer gates, one for each word line in a block of word lines, each transfer gate connected between a word line and one of the first and second voltage buses; and wherein:
the selected block of word lines is enabled for bus transfer responsive to a respective block of transfer gates of the selected block being enabled by the decoded signal at a higher level.

7. A method of operating a nonvolatile memory having an array of memory cells, comprising:
organizing the array of memory cells into a plurality of blocks having interleaving even and odd blocks; each block having a block of word lines for accessing the each block of memory cells;
providing a first voltage bus for all even blocks to access a set of word line voltages;
providing a second voltage bus for all odd blocks to access the set of word line voltages;
providing a block decoder for each pair of adjacent even and odd blocks among the plurality of blocks;
transferring the set of word line voltages to a selected block of word lines by:
putting the set of word line voltages on the first voltage bus or on the second voltage bus depending on whether the selected block of word lines is in an even block or in an odd block; and
decoding a block decoder for a pair of adjacent even and odd blocks containing the selected block of word lines, the decoded block decoder enabling bus transfer of the first voltage bus to the even block of word lines in the selected pair of adjacent blocks and enabling bus transfer of the second voltage bus to the odd block of word lines in the selected pair of adjacent blocks.

8. The method as in claim 7, further comprising:
providing a voltage source for supplying the individual voltages; and wherein:
said putting the set of word line voltages on the first voltage bus is by coupling the voltage source only to the first voltage bus; and
said putting the set of word line voltages on the second voltage bus is by coupling the voltage source only to the second voltage bus.

9. The method as in claim 8, further comprising:
providing a first voltage switch connected between the voltage source and the first voltage bus for switchably coupling the voltage source to the first voltage bus; and
providing a second voltage switch connected between the voltage source and the second voltage bus for switchably coupling the voltage source to the second voltage bus.

10. The method as in claim 9, wherein the first and second switches are not turned on at the same time.

11. The method as in claim 7, further comprising:
providing a block of transfer gates, one for each word line in a block of word lines; and
enabling the block of transfer gates by a block decoder to enable transferring of the set of word line voltages from the first voltage bus or the second voltage bus to the block of word lines.

12. The method as in claim 11, wherein the block decoder outputs a decoded signal and further comprises:
a level shifter for raising the output signal to a level sufficient to enable the block of transfer gates.

13. The method as in claim 11, wherein the block decoder further comprises:
a logic circuit gated by an enable signal for passing a decoded signal; and
a level shifter connected to receive the decoded signal and to output the decoded signal at a higher level sufficient to enable bus transfer of the first voltage bus or the second voltage bus.

14. The method as in claim 7, wherein said nonvolatile memory is of the NAND type, and the block of word lines are associated with word lines of an NAND string.

* * * * *